United States Patent
Aho et al.

(10) Patent No.: US 8,713,248 B2
(45) Date of Patent: Apr. 29, 2014

(54) MEMORY DEVICE AND METHOD FOR DYNAMIC RANDOM ACCESS MEMORY HAVING SERIAL INTERFACE AND INTEGRAL INSTRUCTION BUFFER

(75) Inventors: Eero T. Aho, Tampere (FI); Kimmo K. Kuusilinna, Berkeley, CA (US); Jari A. Nikara, Lempaala (FI)

(73) Assignee: Nokia Corporation, Espoo (FI)

( * ) Notice: Subject to any disclaimer, the term of this patent is extended or adjusted under 35 U.S.C. 154(b) by 668 days.

(21) Appl. No.: 12/455,508

(22) Filed: Jun. 2, 2009

(65) Prior Publication Data

US 2010/0306458 A1    Dec. 2, 2010

(51) Int. Cl.
*G06F 12/00* (2006.01)

(52) U.S. Cl.
USPC .................. 711/105; 711/154; 711/E12.001; 718/103

(58) Field of Classification Search
USPC .................. 711/105, 154, E12.001; 718/103
See application file for complete search history.

(56) References Cited

U.S. PATENT DOCUMENTS

| 6,108,725 | A | 8/2000 | Chatter | 710/56 |
|---|---|---|---|---|
| 6,247,084 | B1 | 6/2001 | Apostol, Jr. et al. | 710/108 |
| 6,622,224 | B1 * | 9/2003 | Cloud | 711/158 |
| RE39,529 | E | 3/2007 | Katsura et al. | 345/531 |
| 2004/0243900 | A1 * | 12/2004 | Henkel | 714/742 |
| 2005/0105381 | A1 | 5/2005 | Dally et al. | 365/233.5 |
| 2005/0210196 | A1 | 9/2005 | Perego et al. | 711/115 |
| 2006/0195631 | A1 | 8/2006 | Rajamani | 710/51 |
| 2007/0005868 | A1 * | 1/2007 | Osborne | 710/310 |
| 2008/0043546 | A1 * | 2/2008 | Barth et al. | 365/193 |
| 2008/0082707 | A1 * | 4/2008 | Gupta et al. | 710/110 |
| 2009/0006798 | A1 * | 1/2009 | Bartley et al. | 711/167 |
| 2009/0080280 | A1 | 3/2009 | Boucard et al. | 365/230.03 |

FOREIGN PATENT DOCUMENTS

EP    1 890 294 A2    2/2008

* cited by examiner

*Primary Examiner* — Yong Choe
(74) *Attorney, Agent, or Firm* — Harrington & Smith

(57) ABSTRACT

A dynamic random access memory integrated circuit includes an interface to a serial interconnect, where the interface is configured to receive a plurality of memory access instructions over the serial interconnect, and a buffer configured to store the plurality of memory access instructions prior to execution of the buffered memory access instructions by the dynamic random access memory integrated circuit. The memory access instructions are received over at least one serial link that forms the serial interconnect, and the at least one serial link may be a shared bi-directional serial link or a uni-directional serial link.

23 Claims, 6 Drawing Sheets

MEMORY DEVICE AND METHOD FOR DYNAMIC RANDOM ACCESS MEMORY HAVING SERIAL INTERFACE AND INTEGRAL INSTRUCTION BUFFER

TECHNICAL FIELD

The exemplary and non-limiting embodiments of this invention relate generally to memory devices and methods, and more specifically relate to a dynamic random access memory (DRAM) integrated circuit and, even more specifically, to a DRAM having at least one serial interface.

BACKGROUND

This section is intended to provide a background or context to the invention that is recited in the claims. The description herein may include concepts that could be pursued, but are not necessarily ones that have been previously conceived, implemented or described. Therefore, unless otherwise indicated herein, what is described in this section is not prior art to the description and claims in this application and is not admitted to be prior art by inclusion in this section.

The following abbreviations that may be found in the specification and/or the drawing figures are defined as follows:
BB baseband
CAS column address strobe
CPU central processing unit
DRDRAM direct rambus DRAM
IC integrated circuit
MC memory controller
MIPI mobile industry processor interface
MMU memory management unit
PCI peripheral component interconnect
PDA personal digital assistants
RAM random access memory
RAS row address strobe
ROM read only memory
SATA serial advanced technology attachment
SCSI small computer system interface
UniPro unified protocol
UE user equipment
USB universal serial bus A general trend in IC interconnections has been the increased usage of serial connections. Memory ICs such as DRAMs, having serial connections, may be used in a number of different types of devices, including computers and handheld units, including mobile communication devices.

Examples of the serial interconnections include PCI Express, SATA, USB, MIPI UniPro, Infiband and Serial RapidIO.

Presently there is at least one type of packet based memory (data, address and instructions are sent in packets). However, this memory uses several reserved command/address and data pins, and the command/address and data interconnections employ synchronous links.

SUMMARY

The foregoing and other problems are overcome, and other advantages are realized, by the use of the exemplary embodiments of this invention.

In a first aspect thereof the exemplary embodiments of this invention provide a method that comprises receiving a plurality of memory access instructions over a serial interconnect at a dynamic random access memory integrated circuit; buffering the plurality of memory access instructions in the dynamic random access memory integrated circuit; and executing the buffered memory access instructions.

In a further aspect thereof the exemplary embodiments of this invention provide a dynamic random access memory integrated circuit that comprises an interface to a serial interconnect, said interface configured to receive a plurality of memory access instructions over the serial interconnect; and a buffer configured to store the plurality of memory access instructions prior to execution of the buffered memory access instructions by the dynamic random access memory integrated circuit.

DETAILED DESCRIPTION

Figure 1A:
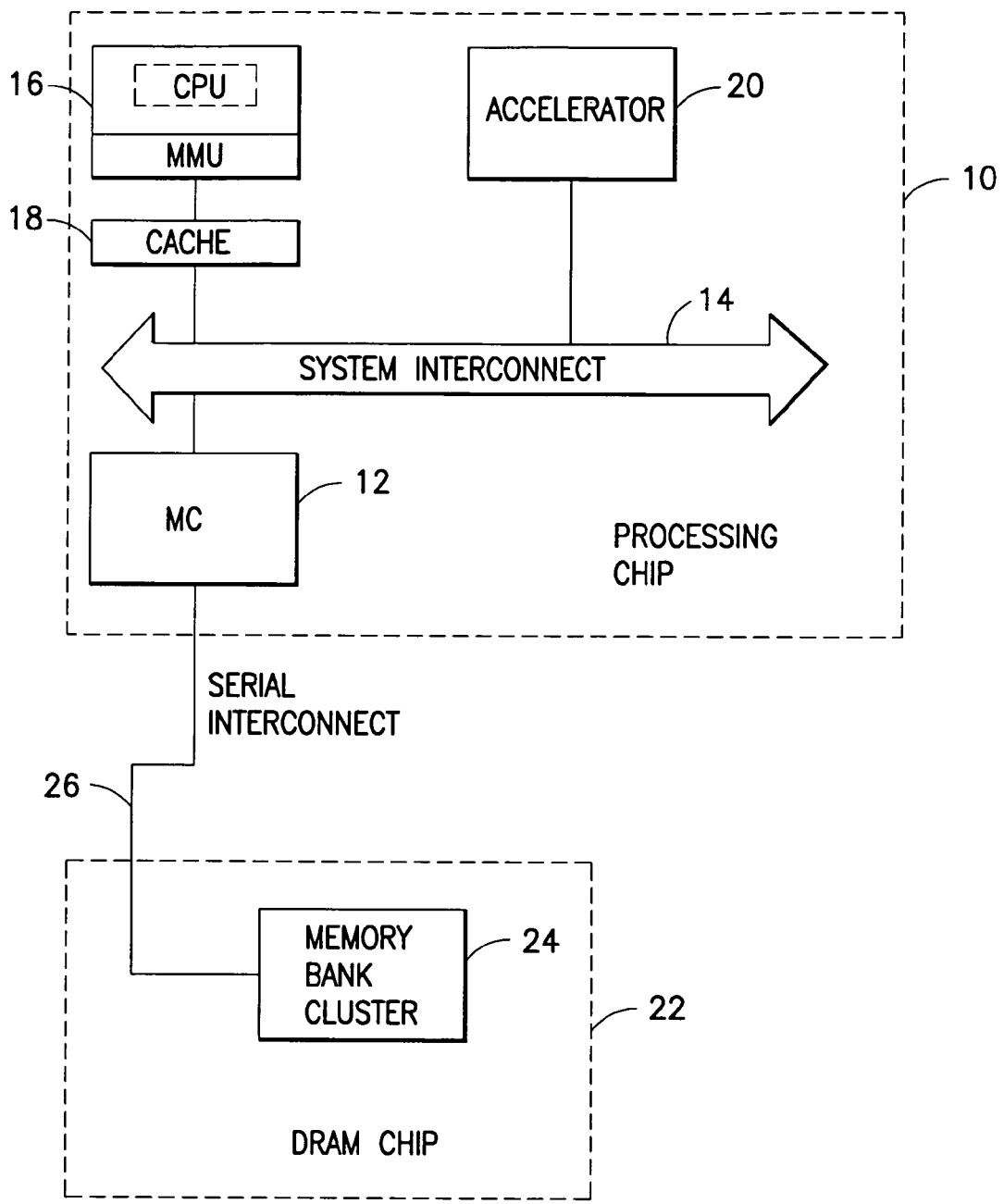
FIG. 1A is a block diagram of a serial DRAM integrated circuit (chip) connected with a MC via a serial interconnect.

Referring to FIG. 1A, a processing chip 10 may include a MC 12 and, as a non-limiting example, a system interconnect 14 connecting together the MC 12 with a CPU/MMU 16 via a cache memory 18. A processing accelerator 20, such as a floating point arithmetic unit and/or a graphical processor, may also be present. A system memory may be located in one or more separate serial DRAM chips 22. By serial memory or serial DRAM what is implied is that the interconnection between the MC 12 and the DRAM 22 is serial. The DRAM chip 22 contains at least one memory bank cluster 24. There is a serial interconnection 26 between the DRAM chip 22 and the MC 12 of the processing chip 10, where the serial interconnection has one or several serial links which maybe independent of one another. Thus, no synchronization may be required between the links.

The serial DRAM 22 may have only shared bi-directional links or half-duplex uni-directional links for communicating data and addresses with the MC 12. Therefore, only data or an address can be transferred at any given time. This leads typically to the following access sequences in the case of a read access:
1. The MC 12 sends address and a read command to the DRAM 22.
2. The DRAM 22 accesses data at the specified address while the MC 12 waits for the data.
3. The DRAM 22 sends the data to the MC 12.
4. The MC 12 send another address and read command to the DRAM 22, and the process repeats.

As may be appreciated, this type of read access procedure has low throughput since the MC 12 has to wait for the data from the DRAM 22 before accessing the next data. In addition, for write operations the MC 12 may need to wait for a first write operation in the DRAM 22 before initiating a next write operation (or before initiating a read operation). Thus, memory access pipelining is not possible with this type of serial DRAM approach.

Figure 1B:
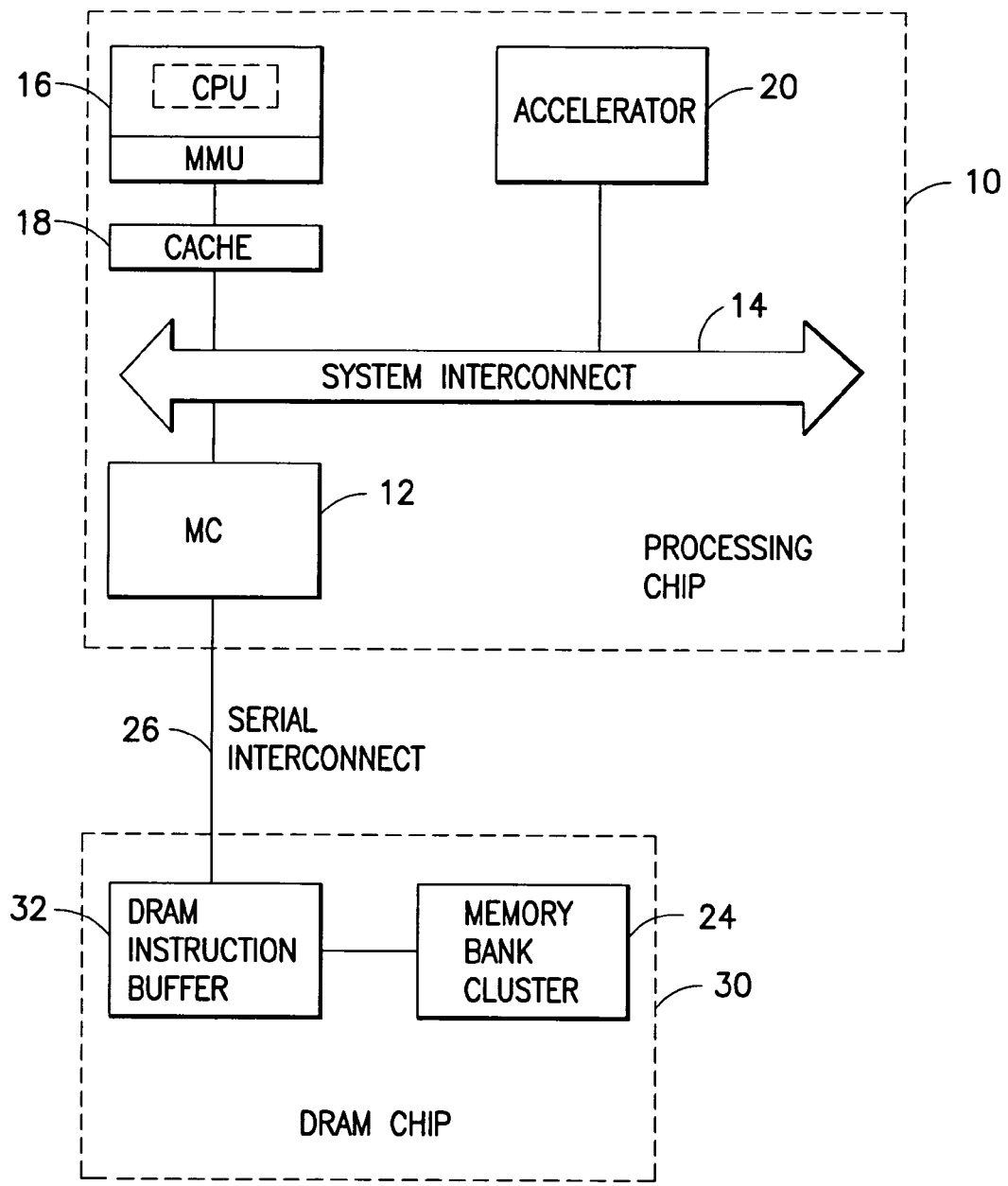
FIG. 1B is a block diagram of a serial DRAM integrated circuit (chip) having an integral instruction buffer in accordance with the exemplary embodiments of this invention.
Figure 1C:
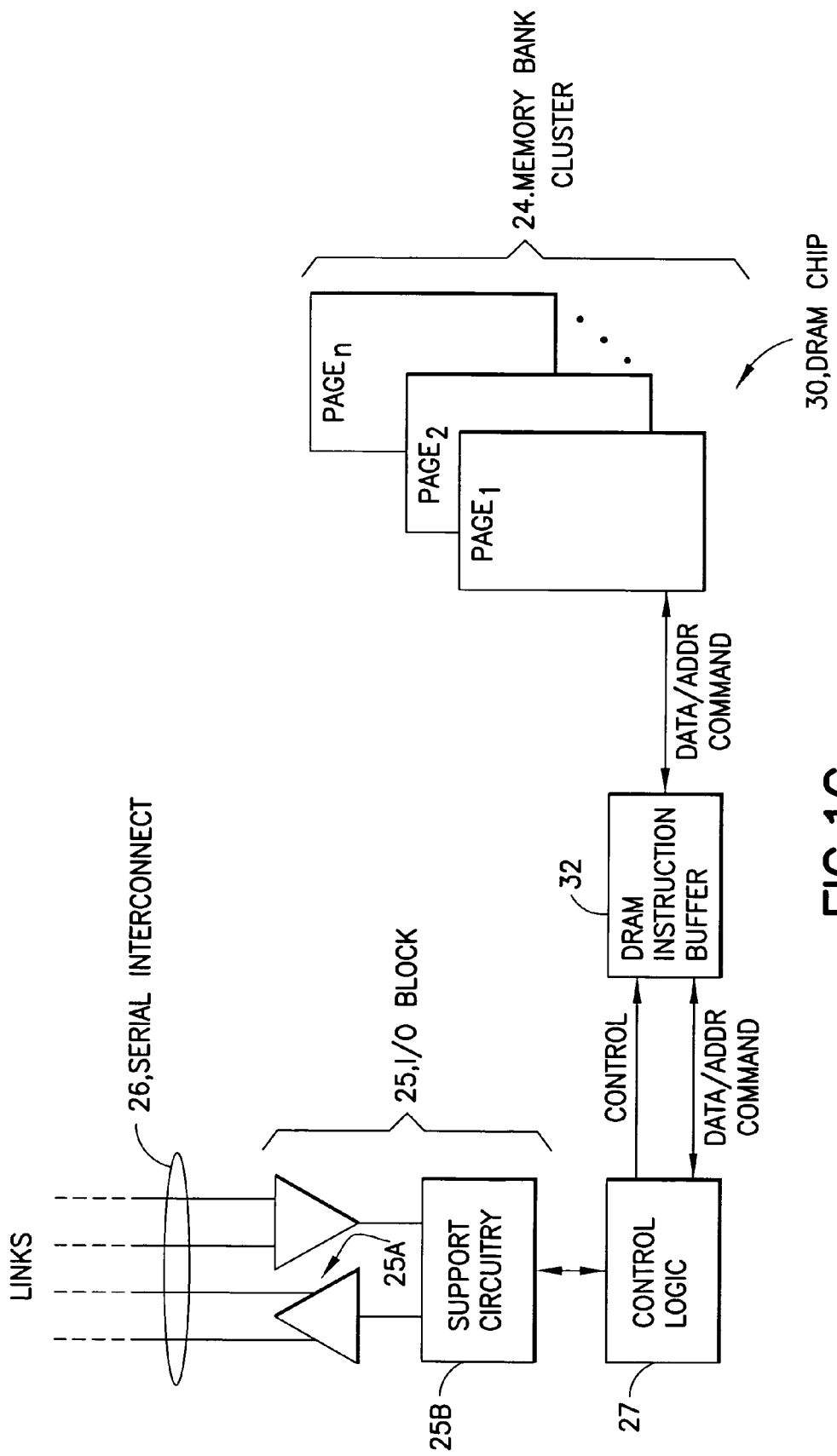
FIG. 1C is a more detailed block diagram of the serial DRAM integrated circuit (chip) having the integral instruction buffer in accordance with the exemplary embodiments of this invention.

An aspect of the exemplary embodiments of this invention provides a serial DRAM 30, shown in FIGS. 1B and 1C, that includes a DRAM instruction buffer 32 interposed between the serial interconnect 26 and the memory bank cluster 24.

A further aspect of the exemplary embodiments of this invention provides improved and enhanced execution memory (serial DRAM memory, main memory) that features increased serial DRAM memory utilization.

The use of the serial interconnect 26 is advantageous for a number of reasons. For example, fewer signals are required with serial links than with parallel interconnections. Further, the physical routing of the signals is facilitated since synchronization between adjacent routed signals is not required. In other words, there is no need to balance propagation delays between routed parallel wires. In addition, the absence of synchronization and balancing between parallel wires allows the clock frequency to be increased, resulting in higher throughput. In addition, the scalability is enhanced as the bandwidth of serial interconnections may be increased simply by increasing the number of links and/or by increasing the data rate of a single link (higher clock speed).

The serial links that form the serial interconnect 26 can be bi-directional or unidirectional. Moreover, the serial links can be shared, and in some embodiments one or more of the serial links may be reserved for a specific purpose (e.g., address links and data links separated). In the half-duplex system communication links operate in both directions, but only one direction can be used at a time, while a full-duplex interconnection allows simultaneous communication in both directions.

The utilization of shared bi-directional serial links has a number of benefits associated therewith. For example, link utilization can be maximized as a free link can be used to send any desired information (e.g., address, data, command) in either direction. Further by example, the scalability is increased as the bandwidth of the serial interconnect 26 can be linearly increased by increasing the number of links, or by increasing the data rate of a single link (or both).

The exemplary embodiments of this invention assume the use of the serial DRAM 30, where the serial interconnect 26 between the MC 12 and the DRAM 30 utilizes shared bi-directional serial links or half-duplex uni-directional serial links. Moreover, the serial links may be independent, meaning that synchronization is not required between the links.

The DRAM instruction buffer 32, which may also be referred to as a DRAM operation buffer, shown in FIGS. 1B and 1C allows the pipelining of DRAM 30 accesses. That is, two or more DRAM accesses can be sent from the MC 12 to the DRAM 30, such as simultaneously with the DRAM 30 accessing data from the memory bank cluster 24. The memory-access related information for one or more DRAM accesses, e.g., address, command, data for a write operation or address, command for a read operation, is buffered or queued in the DRAM instruction buffer 32 and executed when appropriate. Moreover, in a read operation the data accessed from the memory bank cluster 24 may also be buffered or queued to the DRAM instruction buffer 32 and sent to the MC 12 when appropriate.

FIG. 1C is a more detailed block diagram of the serial DRAM integrated circuit (chip) 30 having the integral memory instruction buffer 32 in accordance with the exemplary embodiments of this invention. The DRAM 30 can be seen to include an input/output (I/O) block 25 that provides an interface to the serial interconnect 26 and that includes at least one transmitter and receiver pair, such as the illustrated dual differential pair 25A, and support circuitry 25B that together provide independent bi-directional serial links. In other embodiments the I/O block 25 may provide one or more half-duplex serial links. The DRAM chip 30 further includes a control logic block 27 interposed between the I/O block 25 and the DRAM instruction buffer 32 and the memory bank cluster 24 (which may comprise a plurality of memory pages $Page_1, Page_2, \ldots, Page_n$). The control logic block 27 operates to receive a memory access-related "packet" from the MC 12 via the serial interconnect 26 and to transmit a memory access-related "packet" to the MC 12 via the serial interconnect 26. A received packet includes a memory instruction (e.g., CAS signal, RAS signal and read/write (R/W) command), as well as an address that map into the memory bank cluster 24. The control logic block 27 may be implemented using discrete circuitry, or as a microcontroller operating in accordance with a stored program, or as a combination of discrete circuitry and a microcontroller. The control logic block 27 may be implemented in whole or in part as a state machine. There are at least control and data/address/command buses (may also be a single shared bus for all control/data/address/command) between the control logic 27 and the DRAM instruction buffer 32 whereby multiple memory read and/or write operations may be buffered or queued, thereby effectively pipelining a plurality of memory access requests from the MC 12. Note that the DRAM chip 30 control and data/address/command link(s) may be implemented as parallel buses, or they may be implemented as one or more serial buses. The DRAM instruction buffer 32 may be constructed/operated as a first in/first out (FIFO) buffer whereby the buffered memory access instructions are executed in the order received. Alternatively, the control logic 27 may override the FIFO operation to execute one or more buffered memory access instructions out of sequence, such as when it would be more efficient to do so due to, for example, two non-sequential memory commands referencing a same page of the memory bank cluster 24. The rearrangement of the DRAM accesses can thus be accomplished such that the DRAM characteristics are taken into account to obtain even greater throughput. For example, an access from an open DRAM page is typically more rapid than from a closed page. This type of access rearrangement, when performed in the DRAM chip 30, can be advantageous due at least to the increased (local) knowledge of the DRAM state. In this case it may be desirable to include an identifier, such as a sequence number, with each memory command sent from the MC 12 so that, for example, data returned in response to a memory read operation may be correctly associated with the corresponding memory read command sent from the MC 12. Such an identifier may also be used with a write operation when some acknowledgement may be returned when the write operation is ready.

Figure 2:
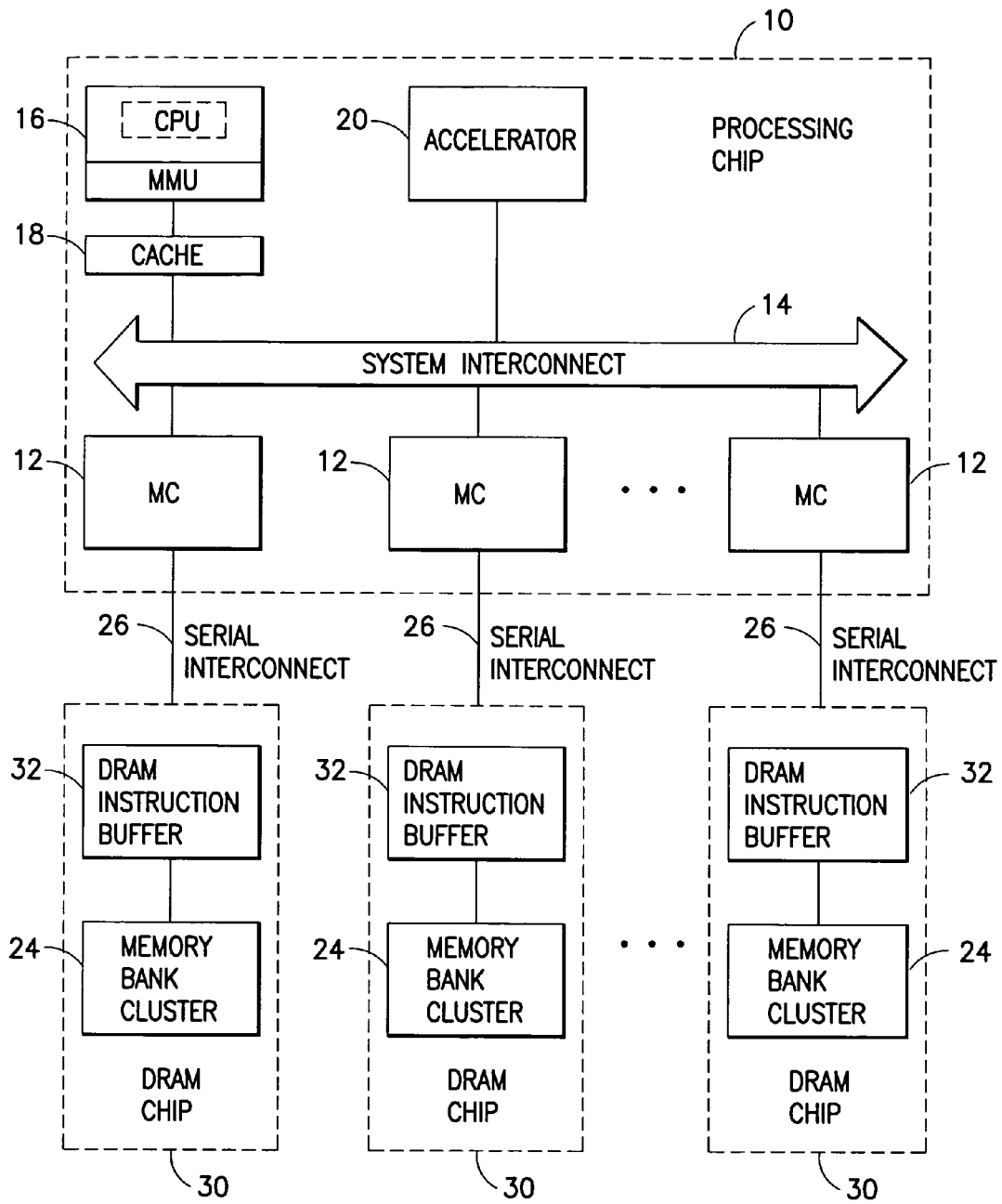
FIG. 2 is a block diagram that shows multiple instances of the DRAM chip of FIGS. 1B and 1C connected with multiple instances of MCs via serial interconnects.

The exemplary embodiments of this invention are also applicable to multi-channel memories with several DRAM chips 30 and memory controllers 12 (see FIG. 1B). This is depicted in FIG. 2, where each DRAM chip 30 includes an instance of the DRAM instruction buffer 32. It should be noted that the exemplary embodiments also pertain to a more centralized case where there is a single DRAM instruction buffer 32 used for all of the serial channels.

The exemplary embodiments of this invention may also be applied to other serial interconnection types that contain, for example, full-duplex uni-directional links, as well as one or more synchronous links (such as in DRDRAM), as it can be employed to aid in balancing throughput differences between the serial links.

To further describe the benefits that may be achieved, consider an example memory system with separate synchronous links for address, data, and command (e.g., 3 links for address, 4 links for data, and 2 links for command). At first, a long data burst is read (e.g., 256 bits) with a single command. Then, several shorter data elements are read (e.g., six 8-bit accesses) with several subsequent commands. Due to the first memory instruction, the data links have high traffic whereas in the following instructions, the address and command links have relatively more traffic. The instruction buffer 32 provides an ability to balance link loads by sending and buffering the six 8-bit access instructions simultaneously when transferring the long 256-bit data.

The exemplary embodiments of this invention may also be applied to the prioritization of memory access requests. Some memory masters may demand low latency memory accesses (such as a modem in a mobile device). The memory accesses sent from a memory controller 12 may include a priority identifier. According to this priority identifier, the memory instructions in the DRAM instruction buffer 32 maybe reordered. As a simple example consider priority numbers 1 and 0, where 1 is normal access and 0 is high priority access that is forwarded before a priority number 1 access. In addition to this priority mechanism, there may be logic to verify that all the accesses are performed within some certain time limits. For example, every third operation is a low priority access, if there are any present. Also, if a low priority access has been waiting for at least some predetermined period of time it may be re-prioritized to a higher priority level. The priority identifier may also be updated/changed according to the control signals given by the memory controller 12 and/or by the control logic 27 in the DRAM chip 30.

The exemplary embodiments of this invention may also be applied to interrupt an access being processed in the memory bank cluster 24. For example, a high priority access may interrupt a lower priority access being processed in the memory bank cluster 24 (e.g., to interrupt a long access burst). Suitable policies may be defined: e.g., a minimum size of bursts that can be interrupted and (delta) limits for the priority level that may interrupt other priority levels (e.g., a priority 2 access can interrupt priority accesses greater than 4, a priority 1 access can interrupt an access having a priority level greater than 2, and so forth). Note that it may be desirable to not employ this embodiment with very short access bursts.

The exemplary embodiments of this invention may also be applied to stall the serial interconnects 26. For example, in a case of shared bi-directional links or half-duplex uni-directional links, the memory controller 12 may desire to interrupt the data being sent from the DRAM chip 30 so that the memory controller 12 can send additional instructions to the DRAM instruction buffer 32. At least three exemplary benefits of being able to stall the serial interconnects include: a) a high priority access may be transferred immediately to the DRAM instruction buffer 32; b) in order to keep the DRAM bank cluster active it would not be desirable to allow the DRAM instruction buffer 32 to become empty; and c) the data being sent to the memory controller 12 is no longer required. In this case the DRAM chip 30 may be responsive to the receipt of a stall instruction to terminate sending information over the serial interconnect 26 to enable the reception of at least one memory access instruction.

The exemplary embodiments of this invention may also be applied to delete a queued memory instruction in the DRAM instruction buffer, such as if the data in question is no longer required. The queued (already buffered) memory access instruction may be deleted according to the control signals given by the memory controller 12 and/or by the control logic 27 in the DRAM chip 30.

Figure 3:
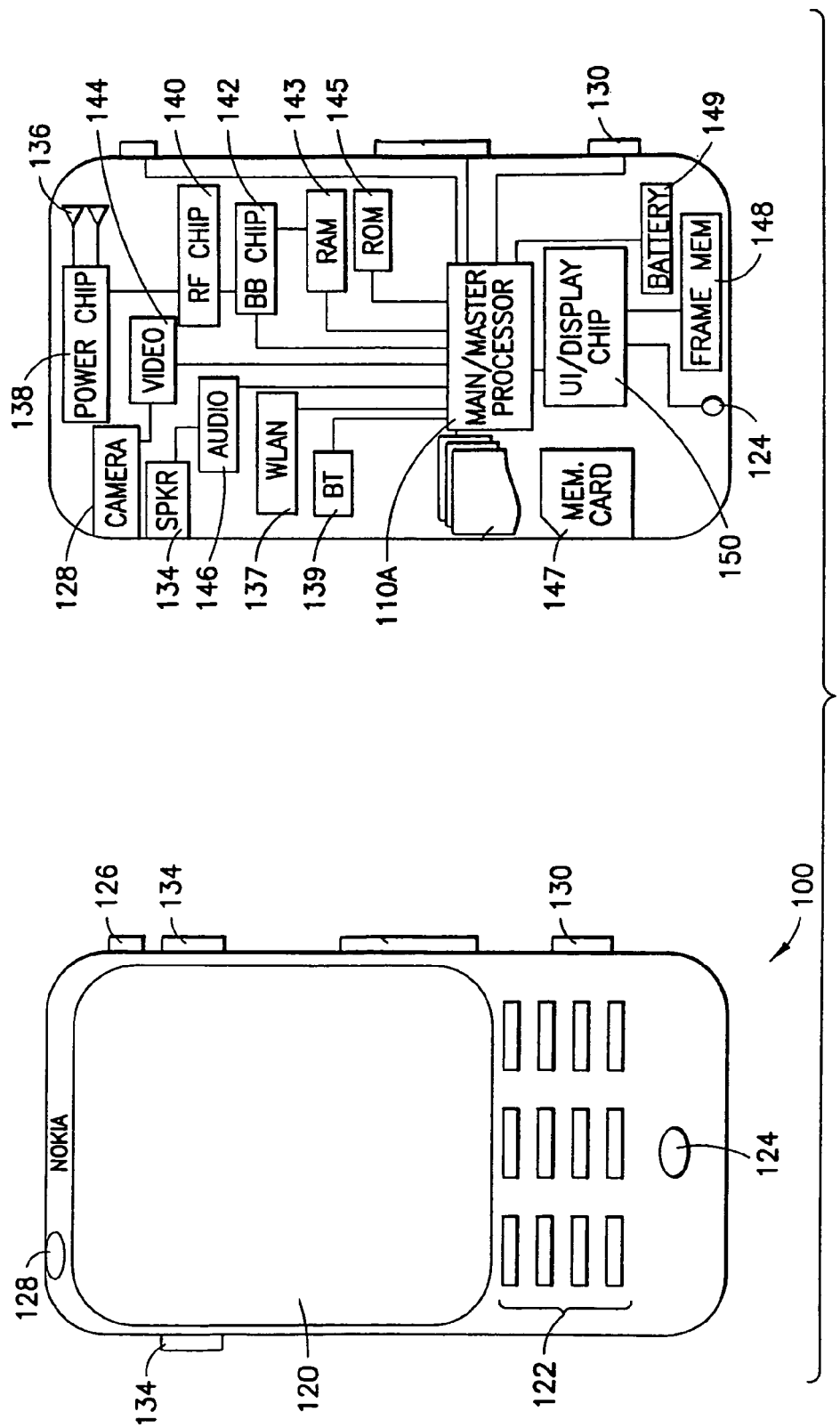
FIG. 3 shows a block diagram of a non-limiting embodiment of a user equipment that contains at least one memory device in accordance with the exemplary embodiments of this invention.

FIG. 3 illustrates an exemplary apparatus, such as a user device which may be a mobile station or a user equipment (UE) 100, in both plan view (left) and sectional view (right). In FIG. 3 the UE 100 has a graphical display interface 120 and a user interface 122 illustrated as a keypad but understood as also encompassing touch screen technology at the graphical display interface 120, as well as voice recognition technology received at a microphone 124. A power actuator 126 controls the device being turned on and off by the user. The exemplary UE 100 may have a camera 128 which is shown as being forward facing (e.g., for video calls) but may alternatively or additionally be rearward facing (e.g., for capturing images and video for local storage). The camera 128 is controlled by a shutter actuator 130 and optionally by a zoom actuator which may alternatively function as a volume adjustment for speaker(s) 134 when the camera 128 is not in an active mode.

Within the sectional view of FIG. 3 are seen multiple transmit/receive antennas 136 that may be used for cellular communication. The antennas 136 may be multi-band for use with other radios in the UE. The operable ground plane for the antennas 136 is shown by shading as spanning the entire space enclosed by the UE housing, though in some embodiments the ground plane may be limited to a smaller area, such as disposed on a printed wiring board on which a power chip 138 is formed. The power chip 138 controls power amplification on the channels being transmitted and/or across the antennas that transmit simultaneously where spatial diversity is used, and amplifies the received signals. The power chip 138 outputs the amplified received signal to the radio frequency (RF) chip 140 which demodulates and downconverts the signal for baseband processing. A baseband (BB) chip 142 detects the signal which is then converted to a bit stream and finally decoded. Similar processing occurs in reverse for signals generated in the apparatus 100 and transmitted from it.

Signals of the camera 128 may pass through an image/video processor 144 that encodes and decodes the various image frames. A separate audio processor 146 may also be present controlling signals to and from the speakers 134 and the microphone 124. The graphical display interface 120 is refreshed from a frame memory 148 as controlled by a user interface chip 150 which may process signals to and from the display interface 120 and/or additionally process user inputs from the keypad 122 and elsewhere.

Certain embodiments of the UE 100 may also include one or more secondary radios such as a wireless local area network radio WLAN 137 and a Bluetooth radio 139, which may incorporate an antenna on the chip or be coupled to an antenna off the chip.

Throughout the apparatus 100 are various memories such as random access memory RAM 143, read only memory ROM 145, the frame memory 148 and in some embodiments removable memory such as the illustrated memory card 147 on which various programs 100C may be stored. All of these components within the UE 100 are normally powered by a portable power supply such as a battery 149.

The processors 138, 140, 142, 144, 146, 150, if embodied as separate entities, may operate in a slave relationship to a main processor 110A which may then be in a master relationship to them. Embodiments of this invention may be disposed across various chips and memories as shown, or disposed within another processor that combines some of the functions described above for FIG. 3. Any or all of these various processors of FIG. 3 access one or more of the various memories, which may be on chip with the processor or separate from the processor.

Note that the various integrated circuits (e.g., chips 138, 140, 142, etc.) that were described above may be combined into a fewer number than described and, in a most compact case, may all be embodied physically within a single chip.

In accordance with the exemplary embodiments of this invention at least one of the illustrated memories is constructed and operated in accordance with the DRAM chip 30 so as to include the integral instruction buffer 32. For example, the RAM 143 may include one or more of the DRAM chips 30, and the main/master processor 110A maybe constructed as the processing chip 10, and may include one or more of the MCs 12.

In general, the various embodiments of the UE 10 can include, but are not limited to, cellular telephones, personal digital assistants (PDAs) having wireless communication capabilities, portable computers having wireless communication capabilities, image capture devices such as digital cameras having wireless communication capabilities, gaming devices having wireless communication capabilities, music storage and playback appliances having wireless communication capabilities, Internet appliances permitting wireless Internet access and browsing, as well as portable units or terminals that incorporate combinations of such functions.

It should be appreciated that the DRAM chip 30 may be used in any type of device or equipment, including devices and equipment that do not have wireless communication capabilities.

It should be further appreciated that the use of the exemplary embodiments of this invention beneficially avoid or minimize blocking behavior of the serial connection(s) to achieve continuous processing in the memory bank cluster pipeline. Memory access requests may be fed into the instruction buffer 32 over the serial interconnect 26 until returning information/data begins to block the serial interconnect 26, and thus sending a new memory access request needs to be delayed. However, due to the presence of the already buffered memory access requests the overall memory bank cluster throughput and activity can remain at a high level. That is, receiving and buffering memory access instructions from the serial interconnect 26 can occur a plurality of times in succession until information being returned over the serial interconnect, in response to execution of one or more buffered memory access instructions, prevents the reception of another memory access instruction. In general, the prevention of a further reception may be caused by information being ready to be returned over the serial interconnect 26 in response to execution of one or more buffered memory access instructions, the buffer 32 being full or nearly full, or another condition or conditions. Note that this scenario may be more likely to occur when the serial interconnect 26 includes shared bi-directional links or half-duplex uni-directional links.

Figure 4:
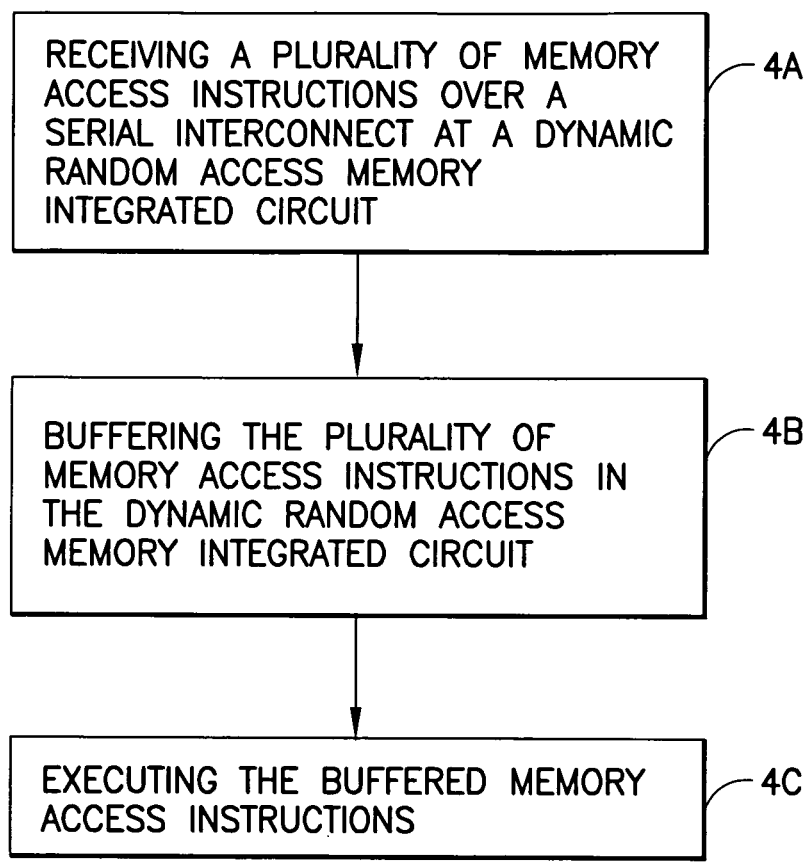
FIG. 4 is a logic flow diagram that illustrates the operation of a method, and a result of execution of program instructions, in accordance with the exemplary embodiments of this invention.

FIG. 4 is a logic flow diagram that illustrates the operation of a method, and a result of execution of program instructions, in accordance with the exemplary embodiments of this invention. In accordance with these exemplary embodiments a method performs, at Block 4A, a step of receiving a plurality of memory access instructions over a serial interconnect at a dynamic random access memory integrated circuit, at Block 4B there is a step of buffering the plurality of memory access instructions in the dynamic random access memory integrated circuit, and at Block 4C there is a step of executing the buffered memory access instructions.

The various blocks shown in FIG. 4 may be viewed as method steps, and/or as operations that result at least in part from operation of stored program code/instructions, and/or as a plurality of coupled logic circuit elements constructed to carry out the associated function(s).

In general, the various exemplary embodiments may be implemented in hardware or special purpose circuits, software, logic or any combination thereof. For example, some aspects may be implemented in hardware, while other aspects may be implemented in firmware or software which may be executed by a controller, microprocessor or other computing device, although the invention is not limited thereto. While various aspects of the exemplary embodiments of this invention may be illustrated and described as block diagrams, flow charts, or using some other pictorial representation, it is well understood that these blocks, apparatus, systems, techniques or methods described herein may be implemented in, as non-limiting examples, hardware, software, firmware, special purpose circuits or logic, general purpose hardware or controller or other computing devices, or some combination thereof.

It should thus be appreciated that the exemplary embodiments of the inventions may be practiced in components such as integrated circuit chips and modules, and that the exemplary embodiments of this invention may be realized in an apparatus that is embodied as an integrated circuit. The integrated circuit may also comprise circuitry (as well as possibly firmware) for embodying at least one or more of a data processor or data processors, a digital signal processor or processors, baseband circuitry and radio frequency circuitry that are configurable so as to operate in accordance with the exemplary embodiments of this invention.

Various modifications and adaptations to the foregoing exemplary embodiments of this invention may become apparent to those skilled in the relevant arts in view of the foregoing description, when read in conjunction with the accompanying drawings. However, any and all modifications will still fall within the scope of the non-limiting and exemplary embodiments of this invention.

It should be noted that the terms "connected," "coupled," or any variant thereof, mean any connection or coupling, either direct or indirect, between two or more elements, and may encompass the presence of one or more intermediate elements between two elements that are "connected" or "coupled" together. The coupling or connection between the elements can be physical, logical, or a combination thereof. As employed herein two elements may be considered to be "connected" or "coupled" together by the use of one or more wires, cables and/or printed electrical connections, as well as by the use of electromagnetic energy, such as electromagnetic energy having wavelengths in the radio frequency region, the microwave region and the optical (both visible and invisible) region, as several non-limiting and non-exhaustive examples.

Furthermore, some of the features of the various non-limiting and exemplary embodiments of this invention may be used to advantage without the corresponding use of other features. As such, the foregoing description should be considered as merely illustrative of the principles, teachings and exemplary embodiments of this invention, and not in limitation thereof.

What is claimed is:

1. A method, comprising:
   receiving a plurality of memory access instructions over a serial interconnect at a dynamic random access memory integrated circuit;

buffering the plurality of memory access instructions in the dynamic random access memory integrated circuit; and executing the buffered memory access instructions;

wherein the plurality of memory access instructions comprise at least one command; and wherein, in response to a first memory access instruction of the buffered plurality of memory access instructions and a second memory access instruction of the buffered plurality of memory access instructions both referencing a same page of the dynamic random access memory integrated circuit, and the first memory access instruction being non-sequential with respect to the second memory access instruction, the dynamic random access memory integrated circuit executing the buffered plurality of memory access instructions in a different order than the order in which they are received.

2. The method of claim 1, where the memory access instructions are received over at least one serial link that forms the serial interconnect, and where the at least one serial link is one of a shared bi-directional serial link, a uni-directional serial link, a full-duplex serial link, or a half-duplex serial link.

3. The method of claim 1, where the memory access instructions comprise a priority indicator for indicating, for a particular memory access instruction, its priority relative to other memory access instructions.

4. The method of claim 3, where buffered memory access instructions are executed in an order of priority such that a memory access instruction having a higher priority is executed before a memory access instruction having a lower priority.

5. The method of claim 3, where a memory access instruction having a high priority interrupts the execution of a memory access instruction having a lower priority.

6. The method of claim 1, where the buffered memory access instructions are executed in the order that they are received.

7. The method of claim 1, where a memory access instruction comprises for a memory read access at least a memory address and a read command, and where a memory access instruction comprises for a memory write access at least a memory address, data to be written and a write command.

8. The method of claim 7, where a memory access instruction further comprises an identifier to enable a recipient of information returned from the memory to associate the returned information with the corresponding memory access instruction.

9. The method of claim 1, where receiving and buffering occur a plurality of times in succession until the reception of another memory access instruction is prevented by an occurrence of at least one condition comprising information being returned over the serial interconnect in response to execution of one or more buffered memory access instructions, or a memory instruction buffer of the dynamic random access memory integrated circuit being full or nearly full.

10. The method of claim 1, further comprising deleting an already buffered memory access instruction.

11. The method of claim 1, further comprising changing the priority indicator of an already buffered memory access instruction.

12. A dynamic random access memory integrated circuit, comprising:

an interface to a serial interconnect, said interface configured to receive a plurality of memory access instructions over the serial interconnect; and a buffer configured to store the plurality of memory access instructions prior to execution of the buffered memory access instructions by the dynamic random access memory integrated circuit;

wherein the plurality of memory access instructions comprise at least one command; and wherein, in response to a first memory access instruction of the buffered plurality of memory access instructions and a second memory access instruction of the buffered plurality of memory access instructions both referencing a same page of the dynamic random access memory integrated circuit and the first memo access instruction being non-sequential with respect to the second memory access instruction, the dynamic random access memo integrated circuit executing the buffered plurality of memory access instructions in a different order than the order in which they are received.

13. The dynamic random access memory integrated circuit of claim 12, where the memory access instructions are received over at least one serial link that forms the serial interconnect, and where the at least one serial link is one of a shared bi-directional serial link, a uni-directional serial link, a full-duplex serial link, or a half-duplex serial link.

14. The dynamic random access memory integrated circuit of claim 12, where the memory access instructions comprise a priority indicator for indicating, for a particular memory access instruction, its priority relative to other memory access instructions.

15. The dynamic random access memory integrated circuit of claim 14, where the where buffered memory access instructions are executed in an order of priority such that a memory access instruction having a higher priority is executed before a memory access instruction having a lower priority.

16. The dynamic random access memory integrated circuit of claim 14, where a memory access instruction having a high priority interrupts the execution of a memory access instruction having a lower priority.

17. The dynamic random access memory integrated circuit of claim 12, where a memory access instruction comprises for a memory read access at least a memory address and a read command, and where a memory access instruction comprises for a memory write access at least a memory address, data to be written and a write command.

18. The dynamic random access memory integrated circuit of claim 17, where a memory access instruction further comprises an identifier to enable a recipient of information returned from the memory integrated circuit to associate the returned information with the corresponding memory access instruction.

19. The dynamic random access memory integrated circuit of claim 12, where reception of another memory access instruction is prevented by an occurrence of at least one condition comprising information being returned over the serial interconnect in response to execution of one or more buffered memory access instructions, or said buffer being full or nearly full.

20. The dynamic random access memory integrated circuit of claim 12, where said dynamic random access memory integrated circuit is responsive to receipt of a stall instruction to terminate sending information on the serial interconnect to enable the reception of at least one memory access instruction.

21. The dynamic random access memory integrated circuit of claim 12, further comprising circuitry to delete an already buffered memory access instruction.

22. The dynamic random access memory integrated circuit of claim 12, further comprising circuitry to change the priority indicator of an already buffered memory access instruction.

23. The dynamic random access memory integrated circuit of claim 12, embodied in a device in combination with at least one data processor and at least one memory controller, where the serial interconnect connects the memory controller and the dynamic random access memory integrated circuit.

* * * * *

UNITED STATES PATENT AND TRADEMARK OFFICE
CERTIFICATE OF CORRECTION

PATENT NO.        : 8,713,248 B2  
APPLICATION NO.   : 12/455508  
DATED             : April 29, 2014  
INVENTOR(S)       : Eero T. Aho et al.

Page 1 of 1

It is certified that error appears in the above-identified patent and that said Letters Patent is hereby corrected as shown below:

In the Claims:

In Claim 12:
Column 10, line 12, "memo" should be deleted and --memory-- should be inserted.

In Claim 12:
Column 10, line 14, "memo" should be deleted and --memory-- should be inserted.

Signed and Sealed this
First Day of July, 2014

Michelle K. Lee
*Deputy Director of the United States Patent and Trademark Office*